(12) United States Patent
Ng et al.

(10) Patent No.: US 6,375,857 B1
(45) Date of Patent: Apr. 23, 2002

(54) METHOD TO FORM FUSE USING POLYMERIC FILMS

(75) Inventors: Chit Hwei Ng; Xu Yi; Sanford Chu, all of Singapore (SG)

(73) Assignee: Chartered Semiconductor Manufacturing Ltd., Hsin-Chu (TW)

( * ) Notice: Subject to any disclaimer, the term of this patent is extended or adjusted under 35 U.S.C. 154(b) by 0 days.

(21) Appl. No.: 09/541,488

(22) Filed: Apr. 3, 2000

(51) Int. Cl.[7] .............. B44C 1/22; C23F 1/00; H01L 21/00
(52) U.S. Cl. .............. 216/19; 216/39; 216/75; 438/720; 438/742
(58) Field of Search .............. 216/13, 19, 20, 216/21, 33, 39, 41, 49, 67, 75–83; 438/689, 710, 720, 725, 742, 745

(56) References Cited

U.S. PATENT DOCUMENTS

| | | | |
|---|---|---|---|
| 3,960,622 A | * 6/1976 | Hofling et al. | 216/19 |
| 5,236,551 A | * 8/1993 | Pan | 216/19 |
| 5,469,981 A | * 11/1995 | Srikrishnan et al. | 216/21 X |
| 5,583,321 A | 12/1996 | DiStefano et al. | 174/264 |
| 5,725,995 A | 3/1998 | Leedy | 430/315 |
| 5,777,540 A | 7/1998 | Dedert et al. | 337/142 |
| 5,925,276 A | 7/1999 | Batiwalla et al. | 219/553 |
| 5,962,815 A | 10/1999 | Lan et al. | 174/262 |

* cited by examiner

*Primary Examiner*—William A. Powell
(74) *Attorney, Agent, or Firm*—George O. Saile; Rosemary L. S. Pike

(57) ABSTRACT

A new method is provided for the creation of a fuse. A layer of metal is first deposited, the layer of metal is patterned and etched creating a metal strip that is interrupted by a gap. The fusing function is created in the gap, the interrupted metal strip serves as the connectors to the fuse. A layer of conducting conjugated polymer is deposited over the metal strip and the therein created gap, the polymer is etched back leaving the deposited polymer in the gap between the two metal strips.

13 Claims, 2 Drawing Sheets

METHOD TO FORM FUSE USING POLYMERIC FILMS

BACKGROUND OF THE INVENTION (1) Field of the Invention

The invention relates to the fabrication of integrated circuit devices, and more particularly, to a method of forming a fuse as an electronic protection circuit by using polymeric films.

(2) Description of the Prior Art

Many if not most of the design and research activities in the field of semiconductors are directed at better methods of design and material applications related to major functions within the semiconductor devices. Therefore not less important is an aspect of semiconductor circuit design that relates to fusing of devices or device areas that are prone to be damaged by surges in voltage or current through these devices or in their immediate vicinity. Fuses are protective devices or device features that have for some time now been known under various names and in a wide variety of applications. There are known thermal fuses, mechanical fuses, spark gap surge arrestors, varistors, and the like whereby each of these devices is designed to interrupt an unexpected and undesired surge of power that is prone to damage or destroy all or part of an electrical circuit arrangement. Many of the known fuses are designed and used in very specified applications whereby, for instance a mechanical fuse is hardly thought of as having any application in semiconductor devices. The latter type of fuses tends to be created in accordance with known semiconductor processes for obvious reasons of cost and applicability. Not only is a fuse required to be readily integratable with its surrounding electrical environment, it must also provide protection against power surges that can reasonably be expected for that environment. As a result, the designer of semiconductor devices or other electronic components must be well aware of the current and voltage conditions that these components can be exposed to and must, based on this insight, select or design a fusing capability that is best suited for a given application.

Due to the increased device miniaturization and the therefrom following increase in device density, more effort is being dedicated to finding and implementing optimum solutions for the fusing problem. Higher device densities in many cases result in significantly higher current densities, which gives the design of a fusing component a different dimension. Cost and performance are, for any component that makes up part of the highly competitive electronics industry, prime considerations. In view of the pressure that this competitive environment creates and in view of the ever-increasing device packaging density, the challenge of providing adequate device and circuit protection takes on increased urgency and poses an increased challenge.

The parameter that is of key importance to the design of an electrical fuse is the amount of heat that the fuse can dissipate before the electrical continuity that the fuse provides is interrupted. This is particularly true for the electro thermal fuse where the current that is flowing through the fuse heats the fuse. As long as expected and regular current flows through the fuse, the temperature of the fuse and with that the ohmic resistance of the fuse remain relatively low, As soon as the current that flows through the fuse exceeds normal levels, the temperature of the fuse increases eventually causing the fuse to open thereby interrupting the current flow through the fuse. The operational efficiency of the thermal fuse is largely dependent on the characteristics of the metallic conductor that forms the conducting body of the fuse. The power that is dissipated by the fuse is proportional to the square of the current that flows through the fuse. With an increase of the current that flows through the fuse, the dissipated power will significantly increase causing the metallic conductor of the fuse to rapidly increase in temperature, eventually causing the metallic conductor to melt thereby opening the conductive path that leads through the fuse. It is clear that effective operation of the thermal fuse under different conditions of circuit applications depends on strict adherence to critical design parameters of the fuse, most notably the design of the metallic conductor of the fuse. For a number of the thermal fuses, the metallic conductor consists of solder whereby the termination pads of the fuse are made of metallic substances with a melting point that is considerably higher than the melting point of solder. Materials that are typically used for the termination pads are silver, ceramic (or glass) and metal glaze. The solder that is used for the main conductive element of the fuse is connected to the termination pads by the application of heat or energy to the interface between the solder and the termination pad, causing the two interfaces to fuse together. This process may be improved by the use of metallic solder power or a flux in the interface between the solder wire and the termination pad. This enhances the fusing of the two interfaces while not affecting reflow of the solder wire of the fuse.

Solder that is applied for the prior art formation of fuses is susceptible to environmental conditions. To reduce this impact, the termination pad is frequently coated with a thin layer of solder or solder paste before the solder wire is attached. This approach provides a method of preventing arcing or reconnection after the solder wire has been broken, a reconnect that can be caused by creating a relatively large opening at the time that the solder wire of the fuse is interrupted. Oxidation of the solder wire can be prevented by coating the solder wire with a layer of deoxidant material. The solder wire of the fuse can further be protected by encapsulation of this wire including the deoxidant material thereby forming a larger tube that surrounds the solder wire with its deoxidant. The current process of forming a fuse is complex and time consuming and can require as many as in excess of a dozen processing steps. Included in these processing steps are steps of application of solder paste with a subsequent reflow of the solder paste, placement of the solder fuse wire with a reflow to connect the wire to the termination pads, rinsing the reflow material, applying/curing deoxidant in at times more than one repeat cycle, applying an adhesive for a cover for the fuse, placing of the cover of the fuse with a curing of the adhesive and finally encapsulation of the completed fuse. It is obvious that this process is expensive and time consuming and can lead to a serious yield detractor. A better method must therefore be provided for the creation of an effective fuse. The process of the invention provides such a method.

For applications where the levels of current and voltage are relatively low, the art has long used conductive polymers to create fusing capability. Polymers, such as for instance fluoropolymer, are typically used as dielectric materials and as such fall in the same class of materials as silicon dioxide ("oxide", doped or undoped) or silicon nitride ("nitride"), silicon oxynitride, parylene, polyimide, tetra-ethyl-orthosilicate (TEOS) based oxides, boro-phosphate-silicate-glass (BPSG), phospho-silicate-glass (PSG), boro-silicate-glass (BSG), oxide-nitride-oxide (ONO), plasma enhanced silicon nitride (PSiNx), and oxynitride. Other polymer materials are polyamide, parylene or teflon, polycarbonate (PC), polysterene (PS), polyoxide (PO) and poly polooxide (PPO), these materials can be used as photoresist applications. In short, polymer compositions can contain silicons, carbons, fluoride, chlorides, and oxygens. It must however be noted that often the term polymer is used to describe chemicals that have been deposited or accumulated (for instance on the sidewalls of an etch chamber). Efforts are also being made to use electrical conductive polymers to connect a chip such as a flip chip or a Ball Grid Array chip to Printed Circuit Board but these efforts are still in the beginning stages.

For applications where a polymer is used in fusing functions, the polymer forms the essence of the body of the fuse while a conductive element is added to the basic polymer component. This conductive element determines the current carrying capability of the fuse and therefore the power level at which the fuse will be interrupted. The conductive polymer that is created in this manner has longitudinal electrodes embedded into the body of the fuse; these electrodes serve to connect the fuse to surrounding circuitry. The resistive element of the fuse is typically surrounded with a protective sleeve that provides electrical isolation and environmental protection for the fuse. The conductive polymer device that is in this manner created can serve to detect and control heat dissipation in particular environments whereby the fuse is interrupted at a point where the temperature of the fuse exceeds a limit.

U.S. Pat. No. 5,777,540 (Dedert et al.) 1998—Encapsulated fuse having a conductive polymer and non-cured deoxidant—shows a fuse structure with conductive polymers interconnects. However, this reference differs from the invention.

U.S. Pat. No. 5,583,321 (Distefano et al.) shows a circuit assembly with conductive polymers (polyacetylene) as a connector.

U.S. Pat. No. 5,925,276 (Batliwalla et al.) discloses a conductive polymer device with a fuse.

U.S. Pat. No. 5,725,995 (Leedy) shows semiconductor probe pins composed of various conductive polymers such as polyacetylene, polythiophene or polypyrrole as examples.

U.S. Pat. No. 5,962,815 (Lan) Antifuse interconnect between two conducting layers of a printed circuit board—shows a multilayered structure having via holes are filled with a second material having a breakdown voltage less than a breakdown voltage of the first material included in the dielectric layer to form an antifuse. The second material in the via holes can be, for example, a conductive epoxy resin or a polymer loaded with conductive particles.

SUMMARY OF THE INVENTION

A principle objective of the invention is to provide a method of forming a fuse using polymeric films as the base material.

Another objective of the invention is to create a fusing function that can be created with a sharply reduced number of processing steps thereby greatly reducing manufacturing complexity and incurred cost for the fusing function.

In accordance with the objectives of the invention a new method is provided for the creation of a fuse. A layer of metal is first deposited, the layer of metal is patterned and etched creating a metal strip that is interrupted by a gap. The fusing function is created in the gap, the interrupted metal strip serves as the connectors to the fuse. A layer of conducting conjugated polymer is deposited over the metal strip and the therein created gap, the polymer is etched back leaving the deposited polymer in the gap between the two metal strips.

DESCRIPTION OF THE PREFERRED EMBODIMENTS

In the art of creating semiconductor devices, material study and the knowledge of material properties is fundamental. One of the aspects of this material study is to understand and to utilize material properties that relate to material conductivity. Relating to material conductivity it is known that polymers that have an uninterrupted conjugate molecular bonding structure constitute low resistivity, high conductivity materials. By reducing the molecular chain length of the conjugate bonding structure, the resistivity of the polymer will increase, the conductivity will decrease.

Typical conductivity of polymers is in the range from between about $10^{-8}$ to $10^7$ Siemen/meter (S/m). As an example, polyacetylene has an electrical conductivity in excess of $4 \times 10^7$ $\Omega^{-1}m^{-1}$ which approaches the conductivity of copper of $6 \times 10^7$ $\Omega^{-1}m^{-1}$. The reduction in the bonding chain length therefore offers a means to control conductivity of a layer of polymer, a characteristic that is used by the invention to create a fuse of a particular conductivity.

The molecular bonding structure of a polymer can be controlled by exposing the polymer to a source of infrared energy at a certain frequency and a certain light intensity. These conditions of exposure can be optimized for particular polymers such that certain frequencies and certain infrared light intensities are best suited for a particular polymer. By continuing this exposure over time, the conjugate bonding structure of the polymer is further reduced to shorter molecular chain lengths thereby having a direct effect on the resistivity of the polymer film. The indicated exposure does not only effect the resistivity of the polymer but also effects other dielectric properties such as the dielectric constant k, dielectric breakdown voltages, and the like. For the process of the invention, of importance is the reduction of the molecular chain length and the therefrom following increase in sheet resistivity of the polymer film that occurs during continued exposure of the polymer film to infrared light. Using this principle as a guideline, the sheet resistivity of a polymer can be controlled and adjusted to a desired value, the value that is required by the fuse of the invention.

Figure 1:
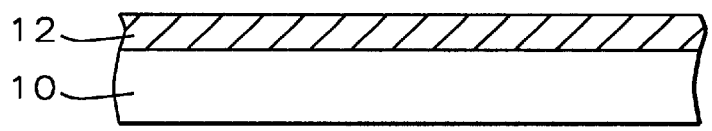
FIG. 1 shows a cross section of a semiconductor substrate on the surface of which has been deposited a layer of metal.

Referring now specifically to FIG. 1, there is shown a cross section of a substrate 10, a layer 12 of metal, for instance copper, is deposited over the surface of the substrate 10. Substrate 10 is typically a single crystal, silicon substrate. The metal layer 12 does not need to be limited to containing copper but can include but is not limited to Al, Ti, Ta, W, Mo, Cu or a combination of these materials. In addition, layer 12 can contain a silicate, a salicide, poly silicon, amorphous silicon or any other semiconductor compatible conductive layer. As an example, the interconnect metalization layer 12 is aluminum, containing between about 1.0 and 3.0% copper, and between about 0.5 and 2.0% silicon, this metalization layer is deposited using rf sputtering at a temperature between about 100 and 400 degrees C. to a thickness between about 4000 and 11000 Angstrom.

The process of the invention deposits the conductive layer 12 if this layer contains metal using conventional methods of metal rf sputtering at a temperature between about 100 and 400 degrees C. and a pressure between about 1 and 100 mTorr using as source a conductive material at a flow rate of between about 10 and 400 sccm to a thickness between about 4000 and 11000 Angstrom.

Figure 2:
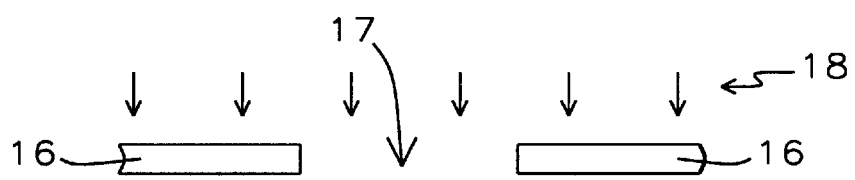
FIG. 2 shows a cross section of the substrate over which a layer of metal has been deposited, a layer of photoresist has been deposited over the layer of metal and is being exposed using a photolithographic mask.

FIG. 2 shows a cross section of the substrate 10 after a layer 14 of photoresist has been deposited over the conductive layer 12 that is being exposed using mask 16. Photolithography is a common approach wherein patterned layers are formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered insoluble (positive-working) and form the pattern, or soluble (negative working) and be washed away. In either case, the remaining resist on the surface forms the desired pattern. The pattern 17 that has been created in the layer 14 of photoresist is the pattern for the body of the to be created fuse. The photoresist material that is used for the formation of layer 14 can be any of the several photoresist materials that are conventionally used in the art, including but not limited to positive photoresist materials and negative photoresist materials. The preferred thickness of layer 14 of photoresist of the invention is between about 1000 and 10,000 Angstrom, the formation of opening 17 in the layer of photoresist exposes the surface of layer 12 over the surface regions of the layer 12 that form the bottom of openings 17.

Figure 3:
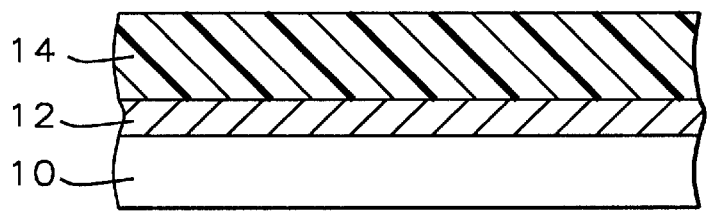
FIG. 3 shows a cross section of the substrate after the layer of photoresist has been etched.

FIG. 3 shows a cross section of the substrate after the layer 14 of photoresist has been etched. The layer 14 of photoresist can be etched by applying $O_2$ plasma ashing and then wet stripping the photoresist by using a $H_2SO_4$, $H_2O_2$ and $NH_4OH$ solution. A photoresist developer often used during development of the photoresist is tetramethyl ammonium hydroxide (TMAH). Other developers such as sodium hydroxide, sodium metasillicide or potassium hydroxide may also be used. However, one of the properties of TMAH relative to other developers is that it is a metal-ion free developer, which reduces metal-ion diffusion and contamination in other parts of the IC.

Figure 4:
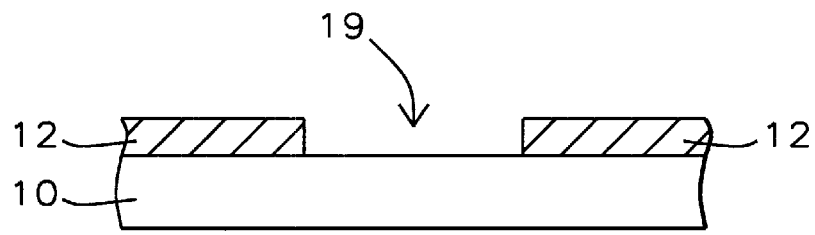
FIG. 4 shows a cross section of the substrate after the layer of metal has been etched and the patterned layer of photoresist has been removed.

FIG. 4 shows a cross section of the substrate 120 after the layer 12 of conductive material has been etched and after the patterned layer 14 of photoresist has been removed from the surface of the substrate.

RIE procedures, using an etchant gas that contains chlorine, such as boron trichlorine ($BCl_3$), carbon tetrachlorine ($CCl_4$), silicon tetrachlorine ($SiCl_4$) or chlorine ($Cl_2$), can be used to etch the metal layer 12. These etching gases are preferred because the etchant products in general are more volatile and more easily pumped from the etching chamber.

The above indicated process of applying $O_2$ plasma ashing to remove the patterned layer 14 of photoresist is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

Other methods for photoresist stripping that are frequently applied use sulfuric acid ($H_2SO_4$) and mixtures of $H_2SO_4$ with other oxidizing agents such as hydrogen peroxide ($H_2O_2$). Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

Figure 5:
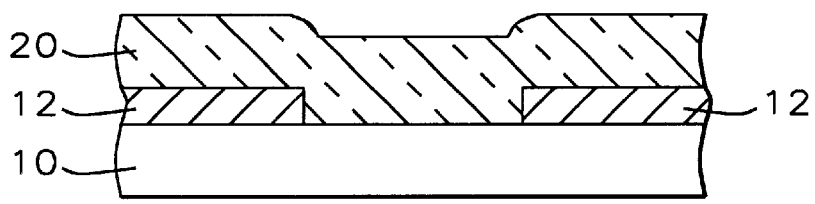
FIG. 5 shows a cross section after a layer of polymer has been deposited over the surface of the patterned layer of metal.

FIG. 5 shows a cross section of the substrate 10 after a layer 20 of polymer has been deposited over the surface of the conductive layer 12 thereby including the opening 19 that has been etched in the layer 12 of conductive material.

The polymer film can be spun onto the wafer and can contain polycarbonate (PC), polystyrene (PS), polyoxides (PO), polymethylmethacrylate (PPMA) and polypolyoxides (PPO). It is important to use a material for the polymer film that can be applied by spin coating and that can, at a later date, be easily removed by dipping the coated substrate in a solvent. Solvents that can be used for this purpose include acetone, THF and trichloro-methane.

Figure 6:
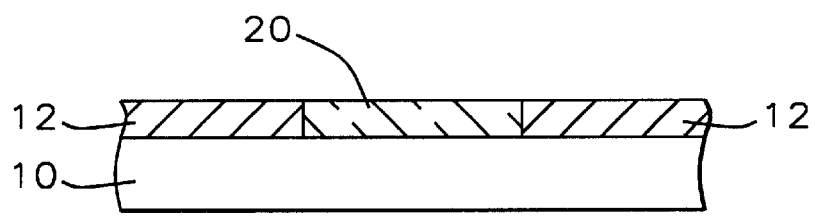
FIG. 6 shows a cross section after the layer of deposited polymer has been etched.

FIG. 6 shows a cross section of the substrate after the layer 20 of polymer has been etched back. The etching of the deposited layer 20 of polymer used for the invention uses a $C_4F_8/CO/Ar$ etch gas mixture. The processing parameters for the etch of polymer layer 20 are as follows: etchant; $C_4F_8$ at a temperature of between about 50 and 70 degrees C. and a pressure between about 50 and 60 mtorr and a flow rate of between about 12 and 16 sccm. The CO gas is processed at a temperature of between about 50 and 70 degrees C. and a pressure of between about 50 and 60 mTorr and a flow rate of between about 300 and 400 sccm. The mix of $C_4F_8$ to CO has a ratio of between about 1/20 and 1/30.

Figure 7:
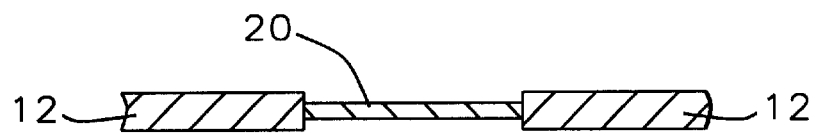
FIG. 7 shows a top view of the created fuse.

FIG. 7 shows a top view of the completed fuse whereby 12 are the conductive connect to the body of the fuse and 20 is the polymer containing body of the fuse.

It must be pointed out that the steps of depositing a layer of polymer and subsequently etching this layer can be repeated a number of times with the objective of achieving good planarity of the surface of the fuse and the surrounding conductive interconnects. This repeat cycle is optional and depends on the level of planarity that is required for the completed fuse.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a fuse having characteristics of resistivity, comprising the steps of:

providing a semiconductor substrate having a surface;

depositing a layer of conductive material over the surface of said substrate;

patterning and etching said layer of conductive material thereby creating two conductive strips having sidewalls over said surface of said substrate whereby said conductive strips are separated by an opening;

depositing a layer of polymer over a surface of said conductive strips thereby including said opening; and etching said deposited layer of polymer down to said conductive strips.

2. The method of claim 1 wherein said conductive material contains a metal.

3. The method of claim 1 wherein said conductive strips have a geometric profile and physical characteristics of an interconnect conductive line whereby each of said two conductive strips are physically located in a direction of an extension of the other conductive strip such that extensions of said sidewalls of said conductive strips coincide.

4. The method of claim 1 wherein said polymer is contains controlled and interrupted conjugated molecular bonding whereby said interrupted conjugated molecular bonding is adjusted to said characteristics of resistivity of said fuse.

5. The method of claim 1 wherein said depositing a layer of conductive material over the surface of said substrate is depositing a layer of metal using methods of metal rf sputtering at a temperature between about 100 and 400 degrees C. and a pressure between about 1 and 100 mtorr using as source a conductive material at a flow rate of between about 10 and 400 sccm to a thickness between about 4000 and 11000 Angstrom.

6. The method of claim 1 wherein said depositing a layer of polymer over a surface of said conductive strips thereby including said opening is spin depositing a layer of said polymer to a thickness between about 7000 and 11000 Angstrom.

7. The method of claim 1 wherein said etching said deposited layer of polymer down to said conductive strips is using a $C_4F_8$/CO/Ar etch gas mixture at a temperature of between about 50 and 70 degrees C. and a pressure between about 50 and 60 mTorr with etchant $C_4F_8$ at a flow rate of between about 12 and 16 sccm with etchant CO at a flow rate of between about 300 and 400 sccm.

8. The method of claim 1 with additional processing steps, said additional steps to be performed as one or more cycles, each cycle of steps to be performed after said step of etching said deposited layer of polymer down to said conductive strips, said steps comprising of:

depositing a layer of polymer over a surface of said conductive strips thereby including said opening; and etching said deposited layer of polymer down to said conductive strips.

9. A method of creating a fuse having characteristics of resistivity, comprising the steps of:

providing a semiconductor substrate having a surface;

depositing a layer of metal over the surface of said substrate;

patterning and etching said layer of metal, thereby creating two metal strips having sidewalls over said surface of said substrate, whereby said metal strips are separated by an opening, said metal strips having a geometric profile and physical characteristics of interconnect conductive lines, whereby each of said two metal strips are physically located in a direction of an extension of the other metal strip such that extensions of said sidewalls of said metal strips coincide;

depositing a layer of polymer over a surface of said metal strips, thereby including said opening separating said two metal strips, whereby said polymer contains controlled and interrupted conjugated molecular bonding, whereby said interrupted conjugated molecular bonding is adjusted to said characteristics of resistivity of said fuse; and etching said deposited layer of polymer down to said metal strips.

10. The method of claim 9 wherein said depositing a layer of metal is using methods of metal rf sputtering at a temperature between about 100 and 400 degrees C. and a pressure between about 1 and 100 mTorr using as source a conductive material at a flow rate of between about 10 and 400 sccm to a thickness between about 4000 and 11000 Angstrom.

11. The method of claim 9 wherein said depositing a layer of polymer over a surface of said conductive strips thereby including said opening is spin depositing a layer of said polymer to a thickness between about 7000 and 11000 Angstrom.

12. The method of claim 9 wherein said etching said deposited layer of polymer down to said conductive strips is using a $C_4F_8$/CO/Ar etch gas mixture at a temperature of between about 50 and 70 degrees C. and a pressure between about 50 and 60 mTorr with etchant $C_4F_8$ at a flow rate of between about 12 and 16 sccm with etchant CO at a flow rate of between about 300 and 400 sccm.

13. The method of claim 9 with additional processing steps, said additional steps to be performed as one or more cycles, each cycle of steps to be performed after said step of etching said deposited layer of polymer down to said conductive strips, said steps comprising of:

depositing a layer of polymer over a surface of said conductive strips thereby including said opening; and etching said deposited layer of polymer down to said conductive strips.

* * * * *